US012690274B2

(12) United States Patent
Wang et al.

(10) Patent No.: US 12,690,274 B2
(45) Date of Patent: Jul. 21, 2026

(54) DISPLAY SUBSTRATE, MANUFACTURING METHOD, AND DISPLAY DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Jun Wang, Beijing (CN); Jun Cheng, Beijing (CN); Haitao Wang, Beijing (CN); Tongshang Su, Beijing (CN); Yongchao Huang, Beijing (CN); Jingang Fang, Beijing (CN); Liu Zhang, Beijing (CN); Shengli Liu, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 370 days.

(21) Appl. No.: 18/272,123

(22) PCT Filed: Jul. 29, 2022

(86) PCT No.: PCT/CN2022/108963
§ 371 (c)(1),
(2) Date: Jul. 13, 2023

(87) PCT Pub. No.: WO2024/021021
PCT Pub. Date: Feb. 1, 2024

(65) Prior Publication Data
US 2024/0387514 A1 Nov. 21, 2024

(51) Int. Cl.
*H10D 89/60* (2025.01)

(52) U.S. Cl.
CPC ......... *H10D 89/911* (2025.01); *H10D 89/921* (2025.01); *H10D 89/931* (2025.01)

(58) Field of Classification Search
CPC ... H10D 89/911; H10D 89/921; H10D 89/931
See application file for complete search history.

(56) References Cited

U.S. PATENT DOCUMENTS

| | | |
|---|---|---|
| 2008/0180591 A1 | 7/2008 | Shie |
| 2021/0200042 A1 | 7/2021 | Huang |
| (Continued) | | |

FOREIGN PATENT DOCUMENTS

| | | |
|---|---|---|
| CN | 106990633 A | 7/2017 |
| CN | 107703691 A | 2/2018 |
| (Continued) | | |

*Primary Examiner* — Peter M Albrecht
(74) *Attorney, Agent, or Firm* — WHDA, LLP

(57) ABSTRACT

The present disclosure provides a display substrate, a manufacturing method thereof and a display device. The display substrate includes a base substrate, a plurality of groups of scanning lines extending along a first direction and arranged along a second direction, and a reference signal line extending along the second direction at an end of each scanning line, and an orthogonal projection of the reference signal line onto the base substrate does not overlap with an orthogonal projection of each scanning line onto the base substrate. The scanning lines include a target scanning line for discharging static electricity and including an electrostatic discharge end arranged at a side of the target scanning line close to the reference signal line, the display substrate further includes an electrostatic discharge structure electrically coupled to the electrostatic discharge end and an electrostatic ring and arranged between the electrostatic discharge end and the reference signal line.

18 Claims, 3 Drawing Sheets

(56) References Cited

U.S. PATENT DOCUMENTS

| | | | |
|---|---|---|---|
| 2021/0201749 A1 | 7/2021 | Du et al. | |
| 2021/0305236 A1 | 9/2021 | Chen et al. | |
| 2024/0334665 A1* | 10/2024 | Hu | ....................... H05K 9/0067 |

FOREIGN PATENT DOCUMENTS

| | | | | |
|---|---|---|---|---|
| CN | 110264929 A | | 9/2019 | |
| CN | 111403424 A | | 7/2020 | |
| CN | 112259563 A | * | 1/2021 | ........... H10D 89/921 |

* cited by examiner

DISPLAY SUBSTRATE, MANUFACTURING METHOD, AND DISPLAY DEVICE

CROSS-REFERENCE TO RELATED APPLICATION

The present application is the U.S. national phase of PCT Application No. PCT/CN2022/108963 filed on Jul. 29, 2022, which is incorporated herein by reference in its entirety.

TECHNICAL FIELD

The present disclosure relates to the field of display technology, in particular to a display substrate, a manufacturing method thereof, and a display device.

BACKGROUND

Static electricity is generate during the manufacture and use of an electronic device such as a display device, and the normal operation of the electronic device is adversely affected by the static electricity. For example, due to the existence of the static electricity, such problems as short circuit or display abnormality occur for the display device. Hence, an electrostatic discharge structure needs to be provided to discharge the generated static electricity, thereby to improve the reliability of the electronic device.

SUMMARY

An object of the present disclosure is to provide a display substrate, a manufacturing method thereof, and a display device, so as to solve the above-mentioned problem.

In one aspect, the present disclosure provides in some embodiments a display substrate, including a base substrate, a plurality of groups of scanning lines, and a reference signal line. The scanning lines extend along a first direction and are arranged along a second direction, the reference signal line extends along the second direction at an end of each scanning line, an orthogonal projection of the reference signal line onto the base substrate does not overlap with an orthogonal projection of each scanning line onto the base substrate, and the first direction intersects the second direction. The scanning lines include a target scanning line for discharging static electricity, the target scanning line includes an electrostatic discharge end arranged at a side of the target scanning line close to the reference signal line, the display substrate further includes an electrostatic discharge structure electrically coupled to the electrostatic discharge end and an electrostatic ring, and the electrostatic discharge structure is arranged between the electrostatic discharge end and the reference signal line.

In a possible embodiment of the present disclosure, each group of scanning lines include a first scanning line and a second scanning line, the first scanning lines and the second scanning lines are arranged alternately in the first direction, the target scanning line includes two groups of scanning lines, and in the two groups of target scanning lines, the electrostatic discharge structure coupled to the first scanning line corresponds to a first electrostatic ring connection line, and the electrostatic discharge structure coupled to the second scanning line corresponds to a second electrostatic ring connection line.

In a possible embodiment of the present disclosure, the display substrate further includes a semiconductor layer, and the first electrostatic ring connection line and the second electrostatic ring connection line are arranged at a same layer as the semiconductor layer.

In a possible embodiment of the present disclosure, the second electrostatic ring connection line is arranged between the first electrostatic ring connection line and the reference signal line.

In a possible embodiment of the present disclosure, an orthogonal projection of the first electrostatic ring connection line onto the base substrate overlaps with an orthogonal projection of the second scanning line onto the base substrate.

In a possible embodiment of the present disclosure, the display substrate further includes a semiconductor layer and a shielding metal layer, the first electrostatic ring connection line is arranged at a same layer as the semiconductor layer, and the second electrostatic ring connection line is arranged at a same layer, and made of a same material, as the shielding metal layer.

In a possible embodiment of the present disclosure, an orthogonal projection of the first electrostatic ring connection line onto the base substrate overlaps with an orthogonal projection of the second electrostatic ring connection line onto the base substrate.

In a possible embodiment of the present disclosure, in the second direction, a distance between the first electrostatic ring connection line and the electrostatic discharge end is less than a distance between the first electrostatic ring connection line and the reference signal line; and/or in the second direction, a distance between the second electrostatic ring connection line and the electrostatic discharge end is less than a distance between the second electrostatic ring connection line and the reference signal line.

In a possible embodiment of the present disclosure, the display substrate further includes a plurality of driving units, and the reference signal line is configured to apply a low voltage reference signal to the driving units.

In a possible embodiment of the present disclosure, in the second direction, a size of the first electrostatic ring connection line is smaller than a size of the reference signal line; and/or a size of the second electrostatic ring connection line is smaller than the size of the reference signal line.

In another aspect, the present disclosure provides in some embodiments a display device including the above-mentioned display substrate.

In yet another aspect, the present disclosure provides in some embodiments a method for manufacturing a display substrate, including: providing a base substrate; and forming scanning lines and a reference signal line on the base substrate. The scanning lines extend along a first direction and are arranged along a second direction, the reference signal line extends along the second direction at an end of each scanning line, an orthogonal projection of the reference signal line onto the base substrate does not overlap with an orthogonal projection of each scanning line onto the base substrate, and the first direction intersects the second direction. The scanning lines include a target scanning line for discharging static electricity, the target scanning line includes an electrostatic discharge end arranged at a side of the target scanning line close to the reference signal line, the display substrate further includes an electrostatic discharge structure electrically coupled to the electrostatic discharge end and an electrostatic ring, and the electrostatic discharge structure is arranged between the electrostatic discharge end and the reference signal line.

In a possible embodiment of the present disclosure, each group of the scanning lines include a first scanning line and a second scanning line, the first scanning lines and the second scanning lines are arranged alternately in the first direction, the target scanning line includes two groups of scanning lines, and in the two groups of target scanning lines, the electrostatic discharge structure coupled to the first scanning line corresponds to a first electrostatic ring connection line, and the electrostatic discharge structure coupled to the second scanning line corresponds to a second electrostatic ring connection line. Prior to forming the scanning lines and the reference signal line on the base substrate, the method further includes: forming a semiconductor layer pattern, a first electrostatic ring connection line pattern and a second electrostatic ring connection line pattern on the base substrate through a single patterning process; and subjecting the first electrostatic ring connection line pattern to conductor-formation treatment to form the first electrostatic ring connection line, and subjecting the second electrostatic ring connection line pattern to conductor-formation treatment to form the second electrostatic ring connection line.

In a possible embodiment of the present disclosure, each group of scanning lines include a first scanning line and a second scanning line, the first scanning lines and the second scanning lines are arranged alternately in the first direction, the target scanning line includes two groups of scanning lines, and in the two groups of target scanning lines, the electrostatic discharge structure coupled to the first scanning line corresponds to a first electrostatic ring connection line, and the electrostatic discharge structure coupled to the second scanning line corresponds to a second electrostatic ring connection line. Prior to forming the scanning lines and the reference signal line on the base substrate, the method further includes: forming a semiconductor layer pattern and a first electrostatic ring connection line pattern on the base substrate through a single patterning process: subjecting the first electrostatic ring connection line pattern to conductor-formation treatment to form the first electrostatic ring connection line; and forming a shielding metal layer pattern and a second electrostatic ring connection line pattern on the base substrate through a single patterning process, the second electrostatic ring connection line pattern being used to form the second electrostatic ring connection line.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Such words as "first" and "second" involved in the specification and the appended claims are merely used to differentiate different objects rather than to represent any specific order. In addition, such words as "include" or "including" or any other variations involved in the present disclosure intend to provide non-exclusive coverage, so that a procedure, method, system, product or device including a series of steps or units may also include any other elements not listed herein, or may include any inherent steps or units of the procedure, method, system, product or device. The expression "and/or" in the description and the appended claims is merely used to represent at least one of the objects before and after the expression. For example, "A and/or B and/or C" represents seven situations, i.e., there is only A, there is only B, there is only C, there are both A and B, there are both B and C, there are both A and C, and there are A, B and C.

The present disclosure provides in some embodiments a display substrate.

Figure 1:
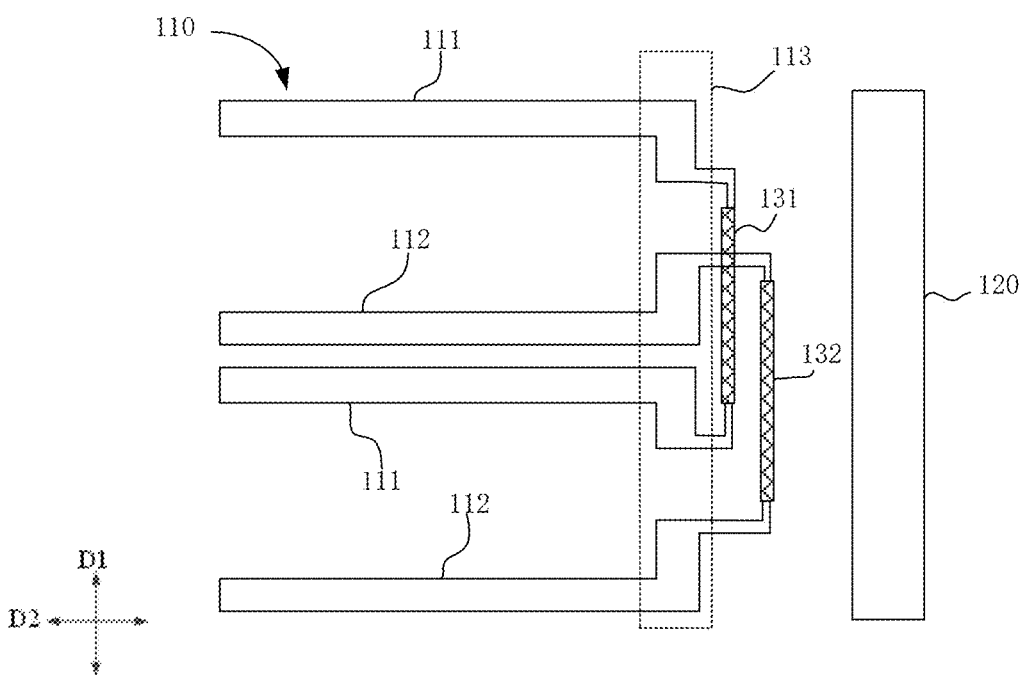
FIG. 1 is a schematic view of a display substrate according to one embodiment of the present disclosure.
Figure 2:
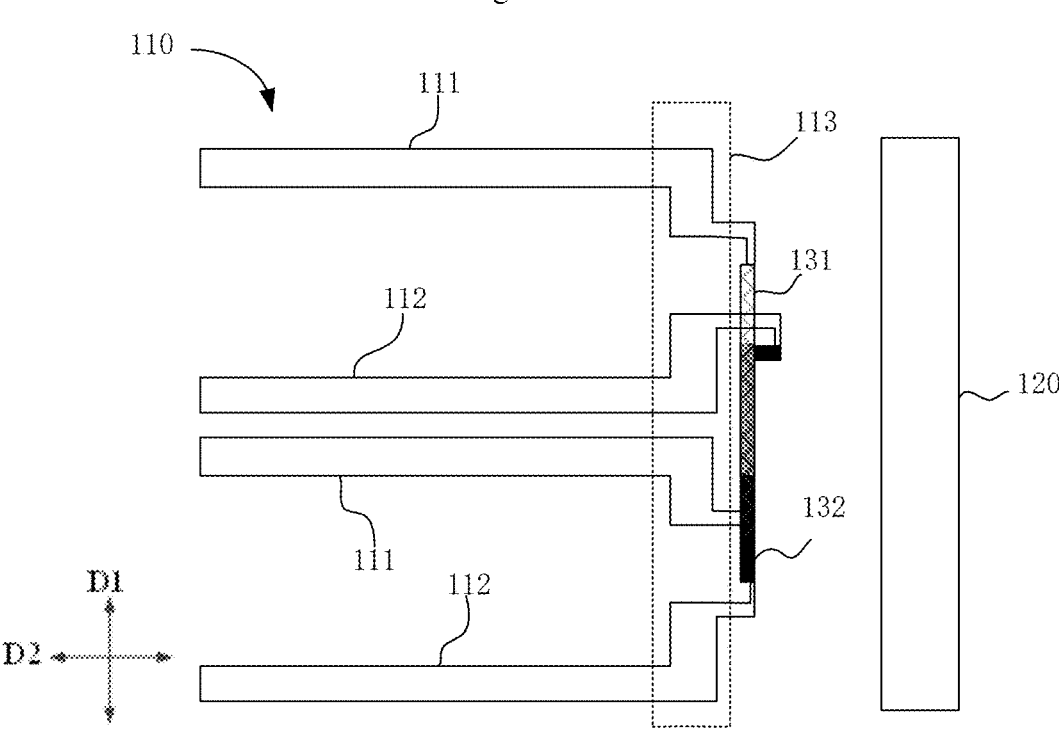
FIG. 2 is another schematic view of the display substrate according to one embodiment of the present disclosure.

As shown in FIGS. 1 and 2, in the embodiments of the present disclosure, the display substrate includes a base substrate BS, a plurality of groups of scanning lines extending in a second direction D2 and arranged in a first direction D1, and a reference signal line 120 extending in the first direction D1 at an end of each scanning line. An orthogonal projection of the reference signal line 120 onto the base substrate does not overlap with an orthogonal projection of each scanning line onto the base substrate BS.

The first direction intersects the second direction, e.g., the second direction is a horizontal direction and the first direction is a longitudinal direction as shown in FIGS. 1 and 2.

As shown in FIGS. 1 and 2, the scanning lines includes a target scanning line 110 for discharging static electricity. The target scanning line 110 includes an electrostatic discharge end 113 arranged at a side of the target scanning line 110 close to the reference signal line 120. The display substrate further includes an electrostatic discharge structure electrically coupled to the electrostatic discharge end 113 and an electrostatic ring. To be specific, the electrostatic discharge end 113, the electrostatic ring and the electrostatic discharge structure are coupled to each other in sequence, and the electrostatic discharge structure is arranged between the electrostatic discharge end 113 and the reference signal line 120.

In the embodiments of the present disclosure, when the electrostatic discharge structure is arranged between the static discharge end 113 and the reference signal line 120, it is able to improve an electrostatic discharge effect of a target signal line and reduce the residual static electricity, thereby to prevent the residual static electricity from being coupled with the reference signal line 120 and reduce the possibility of static electricity generated at the reference signal line 120.

In some embodiments of the present disclosure, the display substrate further includes a plurality of driving units, e.g., gate on array (GOA) units. During the operation of the driving units, a high voltage reference signal (VGH) and a low voltage reference signal (VGL) need to be applied. In the embodiments of the present disclosure, the reference signal line 120 is configured to apply the low voltage reference signal to the driving units.

In some embodiments of the present disclosure, each group of scanning lines include a first scanning line 111 and a second scanning line 112, and the first scanning lines 111 and the second scanning lines 112 are arranged alternately in the first direction. It should be appreciated that, in the embodiments of the present disclosure, each group of scanning lines correspond to sub-pixels in a same row.

The target scanning line 110 includes two groups of scanning lines. In the embodiments of the present disclosure, two groups of scanning lines, i.e., four scanning lines, are used as the target scanning lines 110 for electrostatic discharge.

The electrostatic discharge structure coupled to the first scanning line 111 in the two groups of target scanning lines 110 corresponds to a first electrostatic ring connection line 131. To be specific, in a normal state, an orthogonal projection of the electrostatic discharge structure coupled to the first scanning line 111 onto the base substrate overlaps with an orthogonal projection of the first electrostatic ring connection line 131 onto the base substrate, and the electrostatic discharge structure is insulated from the first electrostatic ring connection line 131 through an insulation layer. When electrostatic breakdown occurs in the insulating layer, the electrostatic discharge structure coupled to the first scanning line 111 is electrically coupled to the first electrostatic ring connection line 131.

Similarly, the electrostatic discharge structure coupled to the second scanning line 112 corresponds to a second electrostatic ring connection line 132. To be specific, in a normal state, an orthogonal projection of the electrostatic discharge structure coupled to the second scanning line 112 onto the base substrate overlaps with an orthogonal projection of the second electrostatic ring connection line 132 onto the base substrate, and the electrostatic discharge structure is insulated from the second electrostatic ring connection line 132 through an insulation layer. When electrostatic breakdown occurs in the insulation layer, the electrostatic discharge structure coupled to the second scanning line 112 is electrically coupled to the second electrostatic ring connection line 132.

In this regard, in the embodiments of the present disclosure, even if the electrostatic breakdown occurs at the position corresponding to the electrostatic ring, there is no short circuit between the first scanning line 111 and the second scanning line 112, and it is able for the first scanning line 111 and the second scanning line 112 to transmit signals in subsequent steps such as testing and debugging. As a result, it is able to improve the reliability of a display panel.

In the embodiments of the present disclosure, the first electrostatic ring connection line 131 and the second electrostatic ring connection line 132 may be arranged in different ways.

In some embodiments of the present disclosure, the display substrate further includes a semiconductor layer SEL, and each of the first electrostatic ring connection line 131 and the second electrostatic ring connection line 132 is arranged at a same layer as the semiconductor layer SEL.

In the embodiments of the present disclosure, the first electrostatic ring connection line 131 and the second electrostatic ring connection line 132 are formed through the semiconductor layer which is subjected to conductor-formation treatment.

Each of two first scanning lines 111 extends through a via-hole to the first electrostatic ring connection line 131, and similarly, each of two second scanning lines 112 extends through a via-hole to the second electrostatic ring connection line 132.

In a possible embodiment of the present disclosure, each of the first electrostatic ring connection line 131 and the second electrostatic ring connection line 132 extends in the first direction.

In a possible embodiment of the present disclosure, the first electrostatic ring connection line 131 is arranged parallel to, and spaced apart from, the second electrostatic ring connection line 132. In this way, the first scanning lines 111 in the target scanning lines 110 are coupled to each other through the first electrostatic ring connection line 131, and the second scanning lines 112 in the target scanning lines 110 are coupled to each other through the second electrostatic ring connection line 132. In addition, it is able to reduce the possibility of any interference or short circuit between the first electrostatic ring connection line 131 and the second electrostatic ring connection line 132.

In some embodiments of the present disclosure, the second electrostatic ring connection line 132 is arranged between the first electrostatic ring connection line 131 and the reference signal line 120, so as to prevent the occurrence of any interference between the two electrostatic ring connection lines.

As shown in FIG. 1, in some embodiments of the present disclosure, an orthogonal projection of the first electrostatic ring connection line 131 onto the base substrate overlaps with an orthogonal projection of the second scanning line 112 onto the base substrate.

In some embodiments of the present disclosure, the display substrate further includes a semiconductor layer SEL and a shielding metal layer SHL. The first electrostatic ring connection line 131 is arranged at a same layer as the semiconductor layer SEL, and the second electrostatic ring connection line 132 is arranged at a same layer, and made of a same material, as the shielding metal layer SHL.

In the embodiments of the present disclosure, the electrostatic ring connection lines are formed through different layers. For example, the first electrostatic ring connection line 131 is formed through the semiconductor layer which is subjected to conductor-formation treatment, and then the electrostatic ring connection line is formed through the shielding metal layer, so as to discharge the static electricity.

Obviously, in some other embodiments of the present disclosure, the electrostatic ring connection lines may also be formed through any other layers in accordance with the practical needs, so as to discharge the static electricity.

In some embodiments of the present disclosure, the orthogonal projection of the first electrostatic ring connection line 131 onto the base substrate overlaps with the orthogonal projection of the second electrostatic ring connection line 132 onto the base substrate.

In the embodiments of the present disclosure, in the case that the two electrostatic ring connection lines are formed through different layers, the two electrostatic ring connection lines may be spaced apart from each other. In some other embodiments of the present disclosure, the first electrostatic ring connection line 131 may overlap with the second electrostatic ring connection line 132 to some extent, so as to reduce a space occupied by them and provide a narrow bezel, thereby to improve the user experience.

As shown in FIG. 2, an orthogonal projection of an overlapping region between the first electrostatic ring connection line 131 and the electrostatic discharge structure onto the base substrate overlaps with the orthogonal projection of the second electrostatic ring connection line 132 onto the base substrate, and an orthogonal projection of an overlapping region between the second electrostatic ring connection line 132 and the electrostatic discharge structure onto the base substrate overlaps with, or does not overlap with, the orthogonal projection of the first electrostatic ring connection line 132 onto the base substrate.

It should be appreciated that, in the embodiments of the present disclosure, the shielding metal layer is arranged between the semiconductor layer and the base substrate. In order to enable the first electrostatic ring connection line 131 to be arranged at a position corresponding to the electrostatic discharge structure and prevent the occurrence of a shielding effect caused by the semiconductor layer, the overlapping region between the first electrostatic ring connection line 131 and the electrostatic discharge structure is adjusted in such a manner that the overlapping region is offset from the semiconductor layer. In this way, it is able to reduce the interference caused by the second electrostatic ring connection line 132 on the first electrostatic ring connection line 131.

In some embodiments of the present disclosure, in the second direction, a distance between the first electrostatic ring connection line 131 and the electrostatic discharge end 113 is less than a distance between the first electrostatic ring connection line 131 and the reference signal line 120; and/or in the second direction, a distance between the second electrostatic ring connection line 132 and the electrostatic discharge end 113 is less than a distance between the second electrostatic ring connection line 132 and the reference signal line 120.

It should be appreciated that, the distance between the first electrostatic ring connection line 131 and the electrostatic discharge end 113 is less than the distance between the first electrostatic ring connection line 131 and the reference signal line 120, and the distance between the second electrostatic ring connection line 132 and the electrostatic discharge end 113 is less than the distance between the second electrostatic ring connection line 132 and the reference signal line 120.

Through adjusting the distance between the first electrostatic ring connection lines 131 and each of the reference signal line 120 and the electrostatic discharge end 113 and adjusting the distance between the second electrostatic ring connection lines 132 and each of the reference signal line 120 and the electrostatic discharge end 113, it is able to reduce the influence of the static electricity on the reference signal line 120, thereby to further improve the reliability of the display substrate.

In some embodiments of the present disclosure, in the second direction, a size of the first electrostatic ring connection line 131 is less than a size of the reference signal line 120; and/or a size of the second electrostatic ring connection line 132 is smaller than the size of the reference signal line 120. It should be appreciated that, a line width of each of the first and second electrostatic ring connection lines is smaller than a width of the reference signal line 120, so as to meet the requirements on the electrostatic discharge and reduce the possibility of any interference on the other structures.

The present disclosure further provides in some embodiments a display device which includes the above-mentioned display substrate.

The implementation of the display device may refer to that of the display substrate mentioned hereinabove with a same technical effect, and thus will not be particularly defined herein.

The present disclosure further provides in some embodiments a method for manufacturing a display substrate.

Figure 3:
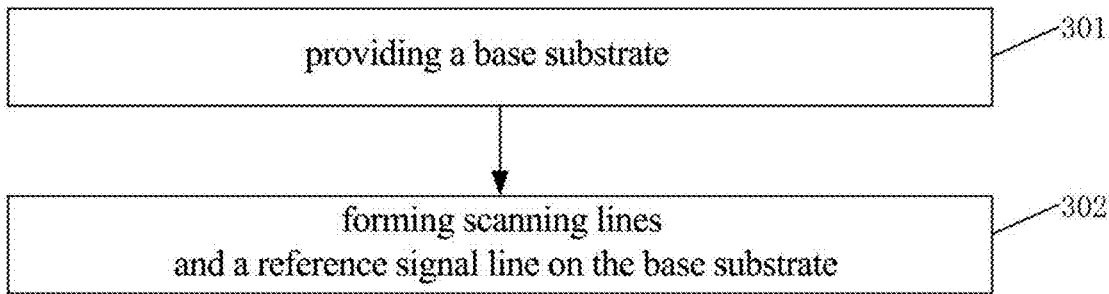
FIG. 3 is a flow chart of a method for manufacturing the display substrate according to one embodiment of the present disclosure.
Figure 4:
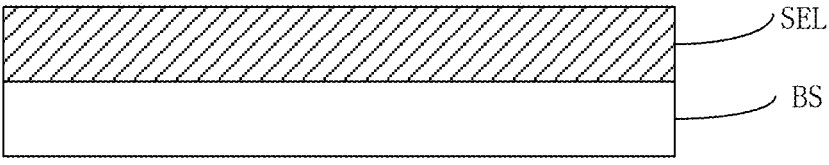
FIG. 4 is a section view of the display substrate according to one embodiment of the present disclosure.
Figure 5:
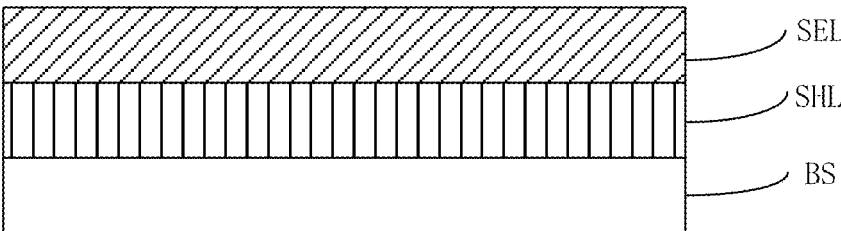
FIG. 5 is another section view of the display substrate according to one embodiment of the present disclosure.

As shown in FIG. 3, in the embodiments of the present disclosure, the method includes: Step 301 of providing a base substrate; and Step 302 of forming scanning lines and a reference signal line on the base substrate.

In the embodiments of the present disclosure, a process for forming the scanning lines and the reference signal line and materials thereof are known in the art, and the structures of the scanning lines and the reference signal line may refer to those mentioned hereinabove, which will thus not be particularly defined herein.

In some embodiments of the present disclosure, prior to Step 302, the method further includes: forming a semiconductor layer pattern, a first electrostatic ring connection line pattern and a second electrostatic ring connection line pattern on the base substrate through a single patterning process; and subjecting the first electrostatic ring connection line pattern to conductor-formation treatment to form the first electrostatic ring connection line, and subjecting the second electrostatic ring connection line pattern to conductor-formation treatment to form the second electrostatic ring connection line.

In the embodiments of the present disclosure, when the electrostatic ring connection line is formed through the semiconductor layer, a structure of a mask is adjusted so as to form the semiconductor layer pattern and the electrostatic ring connection line pattern through a patterning process. Then, the electrostatic ring connection line pattern is subjected to conductor-formation treatment while subjecting the semiconductor pattern to conductor-formation treatment, so as to form the electrostatic ring connection line. In this regard, the steps in the process itself are not adjusted, so it is able to reduce the manufacture cost.

In some embodiments of the present disclosure, prior to Step 302, the method further includes: forming a semiconductor layer pattern and a first electrostatic ring connection line pattern on the base substrate through a single patterning process; subjecting the first electrostatic ring connection line pattern to conductor-formation treatment to form the first electrostatic ring connection line; and forming a shielding metal layer pattern and a second electrostatic ring connection line pattern on the base substrate through a single patterning process, the second electrostatic ring connection line pattern being used to form the second electrostatic ring connection line.

In the embodiments of the present disclosure, the electrostatic ring connection lines are formed through different layers. To be specific, when the semiconductor layer is formed, the first electrostatic ring connection line pattern is formed simultaneously and then subjected to conductor-formation treatment so as to form the first electrostatic ring connection line. When the shielding metal layer is formed through a patterning process, the structure of the mask is adjusted so as to simultaneously form the second electrostatic ring connection line pattern. In this way, the first electrostatic ring connection line and the second electrostatic ring connection line are formed without any adjustment in the process, so it is able to reduce the manufacture cost.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate, a plurality of groups of scanning lines, and a reference signal line, wherein the scanning lines extend along a second direction and are arranged along a first direction, the reference signal line extends along the first direction at an end of each scanning line, an orthogonal projection of the reference signal line onto the base substrate does not overlap with an orthogonal projection of each scanning line onto the base substrate, and the first direction intersects the second direction, wherein the scanning lines comprise a target scanning line for discharging static electricity, the target scanning line comprises an electrostatic discharge end arranged at a side of the target scanning line close to the reference signal line, the display substrate further comprises an electrostatic discharge structure electrically coupled to the electrostatic discharge end and an electrostatic ring, and the electrostatic discharge structure is arranged between the electrostatic discharge end and the reference signal line.

2. The display substrate according to claim 1, wherein each group of scanning lines comprise a first scanning line and a second scanning line, the first scanning lines and the second scanning lines are arranged alternately in the first direction, the target scanning line comprises two groups of scanning lines, and in the two groups of target scanning lines, the electrostatic discharge structure coupled to the first scanning line corresponds to a first electrostatic ring connection line, and the electrostatic discharge structure coupled to the second scanning line corresponds to a second electrostatic ring connection line.

3. The display substrate according to claim 2, further comprising a semiconductor layer, wherein the first electrostatic ring connection line and the second electrostatic ring connection line are arranged at a same layer as the semiconductor layer.

4. The display substrate according to claim 3, wherein the second electrostatic ring connection line is arranged between the first electrostatic ring connection line and the reference signal line.

5. The display substrate according to claim 4, wherein an orthogonal projection of the first electrostatic ring connection line onto the base substrate overlaps with an orthogonal projection of the second scanning line onto the base substrate.

6. The display substrate according to claim 2, further comprising a semiconductor layer and a shielding metal layer, wherein the first electrostatic ring connection line is arranged at a same layer as the semiconductor layer, and the second electrostatic ring connection line is arranged at a same layer, and made of a same material, as the shielding metal layer.

7. The display substrate according to claim 5, wherein an orthogonal projection of the first electrostatic ring connection line onto the base substrate overlaps with an orthogonal projection of the second electrostatic ring connection line onto the base substrate.

8. The display substrate according to claim 2, wherein in the second direction, a distance between the first electrostatic ring connection line and the electrostatic discharge end is less than a distance between the first electrostatic ring connection line and the reference signal line; and/or in the second direction, a distance between the second electrostatic ring connection line and the electrostatic discharge end is less than a distance between the second electrostatic ring connection line and the reference signal line.

9. The display substrate according to claim 2, wherein in the second direction, a size of the first electrostatic ring connection line is smaller than a size of the reference signal line; and/or a size of the second electrostatic ring connection line is smaller than the size of the reference signal line.

10. A display device, comprising the display substrate according to claim 1.

11. A method for manufacturing a display substrate, comprising:

providing a base substrate; and forming scanning lines and a reference signal line on the base substrate, wherein the scanning lines extend along a second direction and are arranged along a first direction, the reference signal line extends along the first direction at an end of each scanning line, an orthogonal projection of the reference signal line onto the base substrate does not overlap with an orthogonal projection of each scanning line onto the base substrate, and the first direction intersects the second direction, wherein the scanning lines comprise a target scanning line for discharging static electricity, the target scanning line comprises an electrostatic discharge end arranged at a side of the target scanning line close to the reference signal line, the display substrate further comprises an electrostatic discharge structure electrically coupled to the electrostatic discharge end and an electrostatic ring, and the electrostatic discharge structure is arranged between the electrostatic discharge end and the reference signal line.

12. The method according to claim 11, wherein each group of the scanning lines comprise a first scanning line and a second scanning line, the first scanning lines and the second scanning lines are arranged alternately in the first direction, the target scanning line comprises two groups of scanning lines, and in the two groups of target scanning lines, the electrostatic discharge structure coupled to the first scanning line corresponds to a first electrostatic ring connection line, and the electrostatic discharge structure coupled to the second scanning line corresponds to a second electrostatic ring connection line.

13. The display substrate according to claim 3, wherein in the second direction, a distance between the first electrostatic ring connection line and the electrostatic discharge end is less than a distance between the first electrostatic ring connection line and the reference signal line; and/or in the second direction, a distance between the second electrostatic ring connection line and the electrostatic discharge end is less than a distance between the second electrostatic ring connection line and the reference signal line.

14. The display substrate according to claim 4, wherein in the second direction, a distance between the first electrostatic ring connection line and the electrostatic discharge end is less than a distance between the first electrostatic ring connection line and the reference signal line; and/or in the second direction, a distance between the second electrostatic ring connection line and the electrostatic discharge end is less than a distance between the second electrostatic ring connection line and the reference signal line.

15. The display substrate according to claim 5, wherein in the second direction, a distance between the first electrostatic ring connection line and the electrostatic discharge end is less than a distance between the first electrostatic ring connection line and the reference signal line; and/or in the second direction, a distance between the second electrostatic ring connection line and the electrostatic discharge end is less than a distance between the second electrostatic ring connection line and the reference signal line.

16. The display substrate according to claim 6, wherein in the second direction, a distance between the first electrostatic ring connection line and the electrostatic discharge end is less than a distance between the first electrostatic ring connection line and the reference signal line; and/or in the second direction, a distance between the second electrostatic ring connection line and the electrostatic discharge end is less than a distance between the second electrostatic ring connection line and the reference signal line.

17. The display substrate according to claim 7, wherein in the second direction, a distance between the first electrostatic ring connection line and the electrostatic discharge end is less than a distance between the first electrostatic ring connection line and the reference signal line; and/or in the second direction, a distance between the second electrostatic ring connection line and the electrostatic discharge end is less than a distance between the second electrostatic ring connection line and the reference signal line.

18. The display substrate according to claim 3, further comprising a plurality of driving units, wherein the reference signal line is configured to apply a low voltage reference signal to the driving units.

* * * * *